United States Patent
Shimizu et al.

(10) Patent No.: US 8,049,223 B2
(45) Date of Patent: Nov. 1, 2011

(54) SEMICONDUCTOR DEVICE WITH LARGE BLOCKING VOLTAGE

(75) Inventors: Haruka Shimizu, Kokubunji (JP); Hidekatsu Onose, Hitachi (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 628 days.

(21) Appl. No.: 12/126,887

(22) Filed: May 25, 2008

(65) Prior Publication Data
US 2009/0014719 A1    Jan. 15, 2009

(30) Foreign Application Priority Data
Jul. 13, 2007    (JP) ................... 2007-183917

(51) Int. Cl.
*H01L 29/04*    (2006.01)
*H01L 29/24*    (2006.01)

(52) U.S. Cl. ............ 257/77; 257/49; 257/256; 257/262; 257/267; 257/272; 257/273; 257/E27.016; 257/E27.017; 257/E27.024; 257/E27.068; 257/E27.069; 257/E27.073; 257/E29.059; 257/E29.194; 257/E29.195

(58) Field of Classification Search .............. 257/77, 257/262, 134–136, 256, 267, 272–273, E27.016, 257/E27.017, E27.024, E27.068–E27.069, 257/E27.073, E29.003, E29.104, E29.059, 257/E29.195, E29.194; 438/186, 194
See application file for complete search history.

(56) References Cited

U.S. PATENT DOCUMENTS

| 6,107,649 A * | 8/2000 | Zhao ........................ 257/138 |
| 2002/0113274 A1* | 8/2002 | Iwagami et al. ............ 257/379 |
| 2004/0135178 A1* | 7/2004 | Onose et al. ................. 257/262 |

FOREIGN PATENT DOCUMENTS
JP    2004-134547 A    4/2003

OTHER PUBLICATIONS
S. Harada et al., "1.8 mΩcm², 10 A Power MOSFET in 4H-SiC," Proceedings of International Electron Device Meeting 2006.

* cited by examiner

*Primary Examiner* — A. Sefer
*Assistant Examiner* — Ermias Woldegeorgis
(74) *Attorney, Agent, or Firm* — Miles & Stockbridge P.C.

(57) ABSTRACT

A junction FET having a large gate noise margin is provided. The junction FET comprises an n⁻ layer forming a drift region of the junction FET formed over a main surface of an n⁺ substrate made of silicon carbide, a p⁺ layer forming a gate region formed in contact with the n⁻ layer forming the drift region and a gate electrode provided in an upper layer of the n⁺ substrate. The junction FET further incorporates pn diodes formed over the main surface of the n⁺ substrate and electrically connecting the p⁺ layer forming the gate region and the gate electrode.

8 Claims, 15 Drawing Sheets

SEMICONDUCTOR DEVICE WITH LARGE BLOCKING VOLTAGE

CROSS-REFERENCE TO RELATED APPLICATION

The present application claims priority from Japanese Patent Application No. JP 2007-183917 filed on Jul. 13, 2007, the content of which is hereby incorporated by reference into this application.

TECHNICAL FIELD OF THE INVENTION

The present invention relates to a semiconductor device, particularly, to a technique advantageously applied to a semiconductor device comprising a semiconductor element made of silicon carbide as a base material.

BACKGROUND OF THE INVENTION

Generally, a semiconductor element available for high power application of several watts or higher is referred to as a power semiconductor element. Specific on-resistance and a blocking voltage of the power semiconductor element are in a trade-off relationship determined by a band gap of a substrate material. Therefore, in order to exceed performance of a silicon (Si) element widely used as the power semiconductor element, a substrate material having a larger band gap than silicon can advantageously be used. Particularly, silicon carbide (SiC) has advantages that the band gap is about three times larger than that of silicon, both p-type and n-type conductivities can be easily achieved, and an oxide film can be formed by thermal oxidation, and therefore, is attracting increasing attention as a promising material for a high performance metal insulator semiconductor field effect transistor (MISFET).

However, the oxide film formed over the silicon carbide substrate has a significant problem. That is, when silicon carbide is subjected to thermal oxidation, carbon remains in the oxide film to form a high-density interface state. This causes significant degradation in channel mobility and significant increase in the specific on-resistance of the MISFET. The carbon remaining in the oxide film also causes degradation in reliability of the oxide film and seriously hinders achievement of the MISFET.

A junction field effect transistor (FET) is a semiconductor element having a structure that solves the problem of the interface of the oxide film. The junction FET is a type of an element using a pn junction as a gate to control a channel. As in a case where silicon is used as a base material, generally, the junction FET is a normally-on type, which is off-state only when a negative voltage is applied to the gate. Note that, since the normally-on type power semiconductor element only has a limited variety of applications for fail-safe reasons, a normally-off type power semiconductor element is generally desirable.

The normally-off type junction FET made of silicon cannot have a high blocking voltage. However, a normally-off type junction FET made of silicon carbide can have the high blocking voltage by reducing a channel. This is because the pn junction in silicon carbide has a high built-in potential of about 2.5V, and therefore, the channel can be closed even if a negative voltage is not applied to the gate.

As described above, a normally-off type high-performance element free from the problem of the interface state of the oxide film can be provided by the junction FET made of silicon carbide as a base material. Note that, an example of such a normally-off type silicon-carbide junction FET is disclosed in Japanese Patent Application Laid-Open Publication No. 2004-134547 (Patent Document 1).

On the other hand, for the power semiconductor element made of silicon carbide as a base material, a buried channel structure has been proposed as a means for avoiding the problem of the gate oxide film while maintaining the MIS structure. FIG. 26 is a cross-sectional view showing a structure of a buried channel MISFET. A reference symbol 30 denotes an n$^+$ substrate forming a drain region, a reference symbol 29 denotes an n$^-$ layer forming a drift region, a reference symbol 28 denotes a p layer forming a body region, a reference symbol 27 denotes a p$^+$ layer forming a lead of the body, a reference symbol 26 denotes an n$^+$ layer forming a source region, a reference symbol 31 denotes a buried n layer, a reference symbol 32 denotes an oxide film (a gate insulating film), a reference symbol 34 denotes a gate electrode, a reference symbol 33 denotes a source electrode, and a reference symbol 35 denotes a drain electrode.

In an ordinary MISFET, a channel is formed in an interface between the p layer 28 forming the p body region and the oxide film 32. However, in the structure shown in FIG. 26, the thin buried n layer 31 is inserted between the p layer 28 forming the p body region and the oxide film 32, thereby locating the channel at a distance from the interface with the oxide film 32. As a result, carriers flowing through the channel are less affected by the interface state, and therefore, the channel mobility is improved. Note that, an example of the buried channel structure is disclosed in "1.8 mΩcm$^2$, 10 A Power MOSFET in 4H-SiC", Proceedings of International Electron Device Meeting 2006 (Non-Patent Document 1).

SUMMARY OF THE INVENTION

However, the normally-off type junction FET and the buried channel MISFET made of silicon carbide as a base material have a common problem that the gate voltage for turning on the element, that is, a threshold voltage is low. The threshold voltage of the normally-off type junction FET is typically about 1 to 2V because the threshold voltage has to be equal to or lower than the built-in potential of the pn junction. And, the threshold voltage of the buried channel MISFET is lower than that of the ordinary MISFET because an n-type region (the buried n layer 31 in FIG. 26) is formed on a surface. In the example disclosed in Non-Patent Document 1, the threshold voltage is about 2V, which is about 3V lower than that of the ordinary MISFET.

If the threshold voltage is low as described above, there is a problem that, when noise is introduced into the gate while the element is in the off state, the gate voltage exceeds the threshold voltage, the element is wrongly turned on, and a large current flows through the element to damage the element.

An object of the present invention is to provide a gate-controlled type semiconductor element having a large gate noise margin.

The above and other objects and novel characteristics of the present invention will be apparent from the description of this specification and the accompanying drawings.

The typical ones of the inventions disclosed in this application will be briefly described as follows.

A semiconductor device according to the present invention comprises a semiconductor element made of silicon carbide as a base material having a plurality of diodes incorporated over a chip of the semiconductor element, wherein a first diode of the plurality of diodes has an anode connected to a gate of the semiconductor element and a cathode connected to a gate pad of the chip, and wherein a second diode of the plurality of diodes has a cathode connected to the gate of the semiconductor element and an anode connected to the gate pad of the chip.

The effects obtained by typical aspects of the present invention will be briefly described below.

According to the present invention, when the gate voltage is low, most of a voltage applied to the gate is applied to the diode, and the junction FET is not turned on, and when the gate voltage becomes equal to or higher than the built-in potential of the diode, an excess voltage is applied to the gate of the junction FET. Therefore, the apparent threshold voltage of the junction FET is increased, and the gate noise margin is increased.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
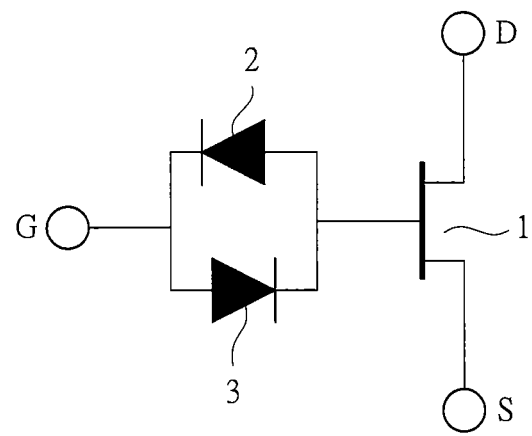
FIG. 1 is an equivalent circuit diagram of a semiconductor device according to a first embodiment of the present invention.
Figure 2:
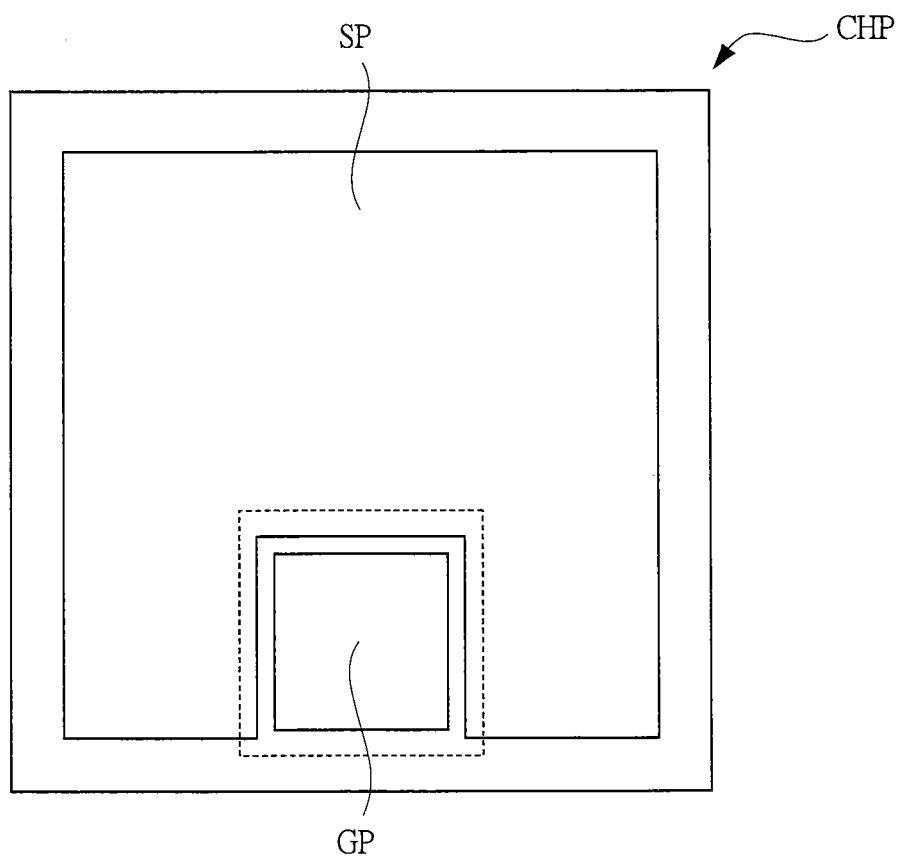
FIG. 2 is a plan view of the semiconductor device according to the first embodiment of the present invention.
Figure 3:
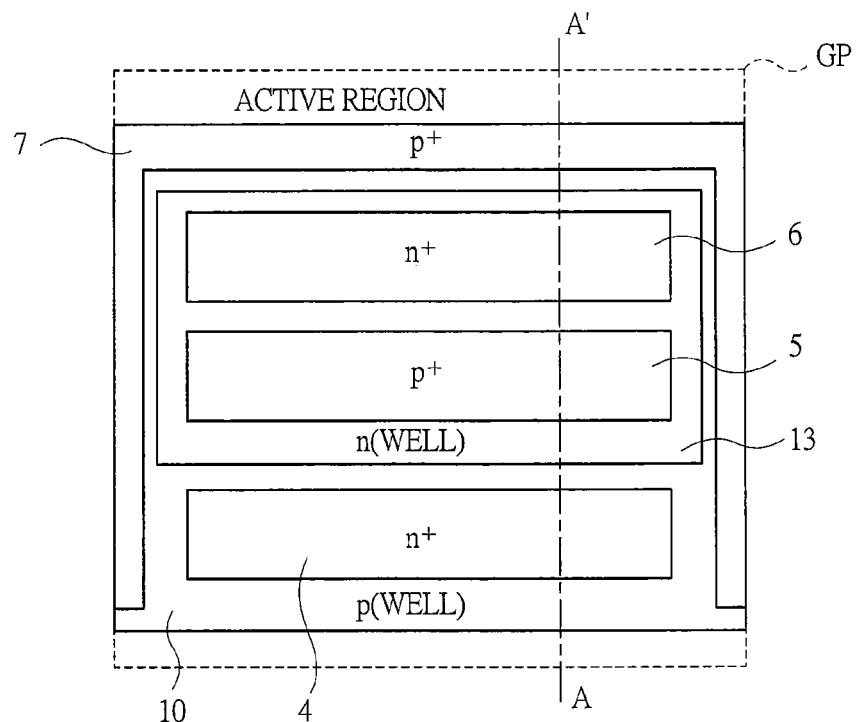
FIG. 3 is a plan view showing essential parts of the semiconductor device according to the first embodiment of the present invention.
Figure 4:
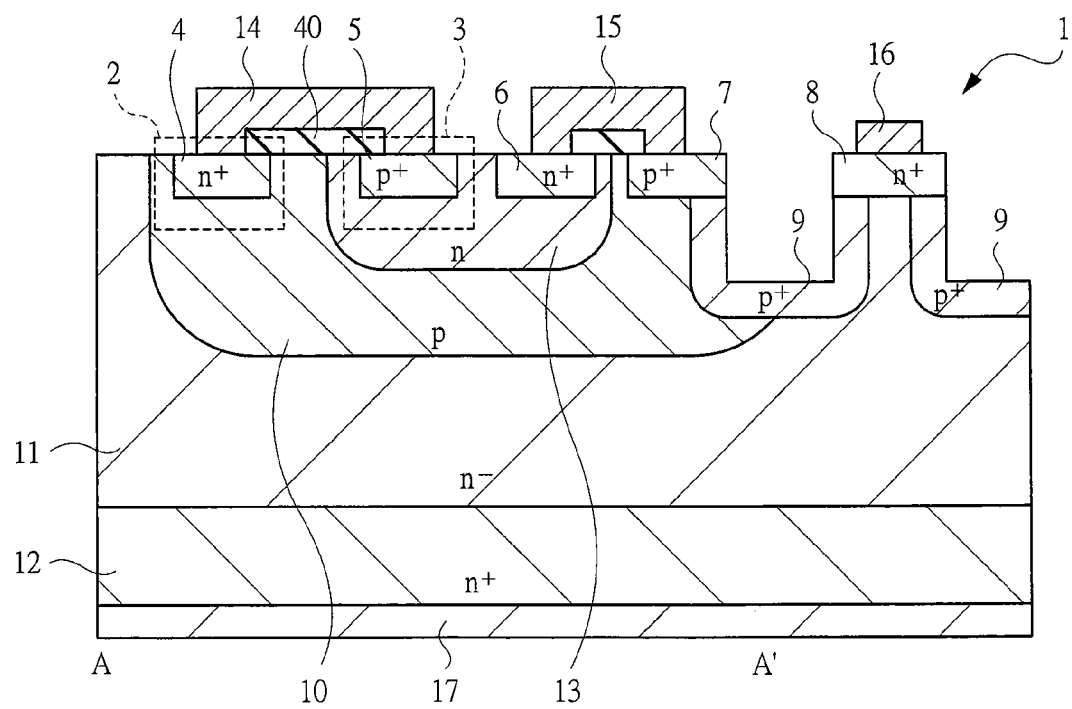
FIG. 4 is a cross-sectional view showing essential parts of the semiconductor device according to the first embodiment of the present invention.

First, in a first embodiment, a semiconductor device having a junction FET as a gate-controlled type semiconductor element (a switching element, a transistor) will be described with reference to FIGS. 1 to 4. FIGS. 1 to 4 are an equivalent circuit diagram of, a plan view of, a plan view showing essential parts of, and a cross-sectional view showing essential parts of the semiconductor device according to the first embodiment, respectively. FIG. 2 shows the semiconductor device as a chip (CHP), and a gate pad GP and a source pad SP are formed over the chip CHP. FIG. 3 is a plan view of a region of the gate pad GP in FIG. 2 from which the gate pad GP is removed. A cross-sectional view taken along a line A-A' in FIG. 3 is shown in FIG. 4. Note that, in this application, the gate pad GP is sometimes referred to as a gate electrode, and the source pad SP is sometimes referred to as a source electrode. And, as shown in FIG. 4, a drain electrode 17 is formed as a back surface electrode of the chip CHP shown in FIG. 2.

The semiconductor device according to the first embodiment is provided with a trench junction FET 1 using an $n^+$ substrate (a semiconductor substrate) 12 made of silicon carbide as a base material provided in an active region. The junction FET 1 is composed of an $n^+$ layer 8 forming a source region, an $n^-$ layer 11 forming a drift region, an $n^+$ substrate 12 forming a drain region, a $p^+$ layer 9 forming a gate region, a gate electrode 14 electrically connected to the gate pad GP, a source electrode 16 electrically connected to the source pad SP, and a drain electrode 17. As described later, in the junction FET 1, the p⁺ layer 9 forming the gate region and the n⁻ layer 11 forming the drift layer are in contact with each other (see FIG. 4), and by a depletion layer spreading from an interface thereof, the width of the channel is reduced.

The n⁻ layer 11 forming the drift region is formed over the n⁺ substrate 12. In the present application, a combination of the n⁺ substrate 12 and the n⁻ layer 11 is sometimes referred to as a substrate. A groove for a trench gate is formed in a front surface side of the n⁻ layer 11, and the p⁺ layer 9 forming the gate region is formed along the groove. And, the n⁺ layer 8 forming the source region is formed in the front surface side of the n⁻ layer 11. In addition, the gate electrode 14 and the source electrode 16 are formed over a main surface (an element forming surface) of the substrate, and the drain electrode 17 is formed over a back surface of the substrate. The gate electrode 14 is electrically connected to the p⁺ layer 9 forming the gate region, the source electrode 16 is electrically connected to the n⁺ layer 8 forming the source region, and the drain electrode 17 is electrically connected to the n⁺ substrate 12 forming the drain region.

And, the semiconductor device according to the first embodiment comprises diodes, specifically, pn diodes 2 and 3. In the pn diode 2, a p well 10 forming an anode is electrically connected to the p⁺ layer 9 forming the gate region and an n⁺ layer 4 forming a cathode is electrically connected to the gate electrode 14. And, in the p-n diode 3, an n well 13 forming a cathode is electrically connected to the p⁺ layer 9 forming the gate region and a p⁺ layer 5 forming an anode is electrically connected to the gate electrode 14. That is, when the p⁺ layer 9 forming the gate region is viewed from the gate electrode 14, the pn diode 2 is connected in a reverse direction, the pn diode 3 is connected in a forward direction, and the pn diode 2 and the pn diode 3 are connected in parallel.

As described above, in the first embodiment, in the region of the gate pad GP of the trench junction FET 1 made of silicon carbide as a base material, the pn diodes 2 and 3 are formed. One of the pn diodes is connected in the reverse direction, the other is connected in the forward direction, and they are connected in parallel. The gate pad GP is made of the same material and formed in the same layer as the gate electrode 14 and electrically connected to the gate electrode 14. In this way, in the first embodiment, the junction FET 1 comprises the pn diodes 2 and 3 electrically connecting the p⁺ layer 9 forming the gate region and the gate electrode 14. The diodes are formed on a part of the main surface of the substrate under the gate pad GP shown in FIG. 2, and the junction FET 1 is formed on a part of the main surface of the substrate under the source pad SP, that is, in the active region.

Specifically, the pn diode 2 is composed of a pn junction structure of the p well 10 formed in the region of the gate pad GP of the element and the n⁺ layer 4 formed over the p well 10, and the p well 10 is directly connected to the p⁺ layer 9. The pn diode 3 is composed of the n well 13 formed in the p well 10 and the p⁺ layer 5 formed over the n well 13, and the n well 13 is connected to the p⁺ layer 9 forming the gate region via the n⁺ layer 6, a contact electrode 15 and a p⁺ layer 7. That is, the pn diodes 2 and 3 made of silicon carbide configuring the n⁺ substrate 12 as base materials are provided.

Next, operation of the junction FET 1 according to the first embodiment is described. First, if a voltage is applied to the gate electrode 14, the voltage is distributed between a diode portion (the p-n diodes 2 and 3) and the junction FET 1. A voltage distribution ratio is in inverse proportion to a ratio between capacitance of the diode portion and gate capacitance of the junction FET 1. That is, a lower voltage is applied to one of the junction FET 1 and the diode portion having lower capacitance. In this case, an area of the diode portion formed under the gate pad GP is significantly smaller than a total area of the gate (the p⁺ layer 9 forming the gate region), and therefore, the capacitance of the diode portion is significantly smaller than the capacitance of the gate of the junction FET 1, and as a result, most of the voltage is applied to the diode portion. Note that, total capacitance of the diode portion is determined by a sum of capacitance of the pn diode 2 in the reverse direction and capacitance of the pn diode 3 in the forward direction. However, the capacitance of the pn diode 2 in the reverse direction is extremely small because the depletion layer expands, and therefore, the voltage distribution is determined by the capacitance of the pn diode 3 in the forward direction.

Then, if the gate voltage is increased and the pn diode 3 in the forward direction is turned on, the depletion layer in the pn diode 3 is substantially eliminated and the capacitance increases. As a result, the voltage is applied also to the junction FET 1. If the gate voltage is further raised, the junction FET 1 is turned on.

Figure 5:
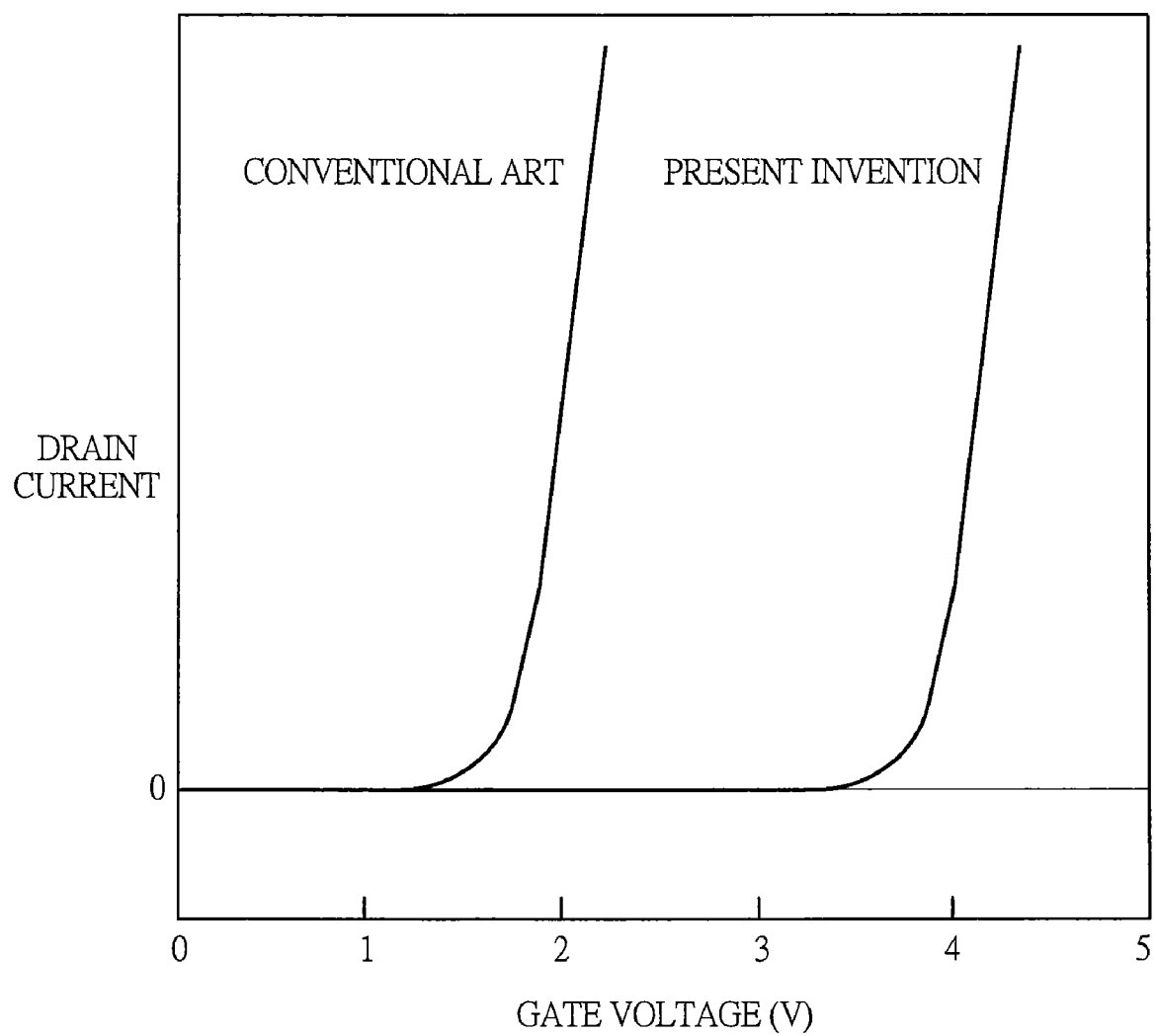
FIG. 5 is a characteristic diagram of a junction FET according to the first embodiment of the present invention.

FIG. 5 is a characteristic diagram of the junction FET 1 according to the first embodiment of the present invention. Since the built-in potential of the pn junction in silicon carbide is about 2.5V, the threshold voltage can be about 2.5V higher than that of the conventional junction FET having no diode portion.

When the junction FET 1 is switched on or off, charging or discharging occurs according to the capacitance of the gate. The pn diode 2 in the reverse direction is connected in parallel with the pn diode 3 to ensure a path for a current during such discharging so as to prevent increase of switching loss due to delay of switching. That is, the pn diode 2 in the reverse direction is required only to ensure the current path at switching. Therefore, the built-in potential of the pn diode 2 in the reverse direction is preferably small. In the first embodiment, the p well 10 of the pn diode 2 in the reverse direction has a lower concentration than the n well 13 of the pn diode 3 in the forward direction, and therefore, the pn diode 2 in the reverse direction has the built-in potential lower than that of the pn diode 3 in the forward direction. And, it is effective to use a Schottky barrier diode having the low built-in potential as the pn diode 2 in the reverse direction.

Next, a method of manufacturing a semiconductor device according to the first embodiment is described in order with reference to FIGS. 6 to 12. FIGS. 6 to 12 are cross-sectional views showing essential parts of the semiconductor device in manufacturing steps according to the first embodiment.

Figure 6:
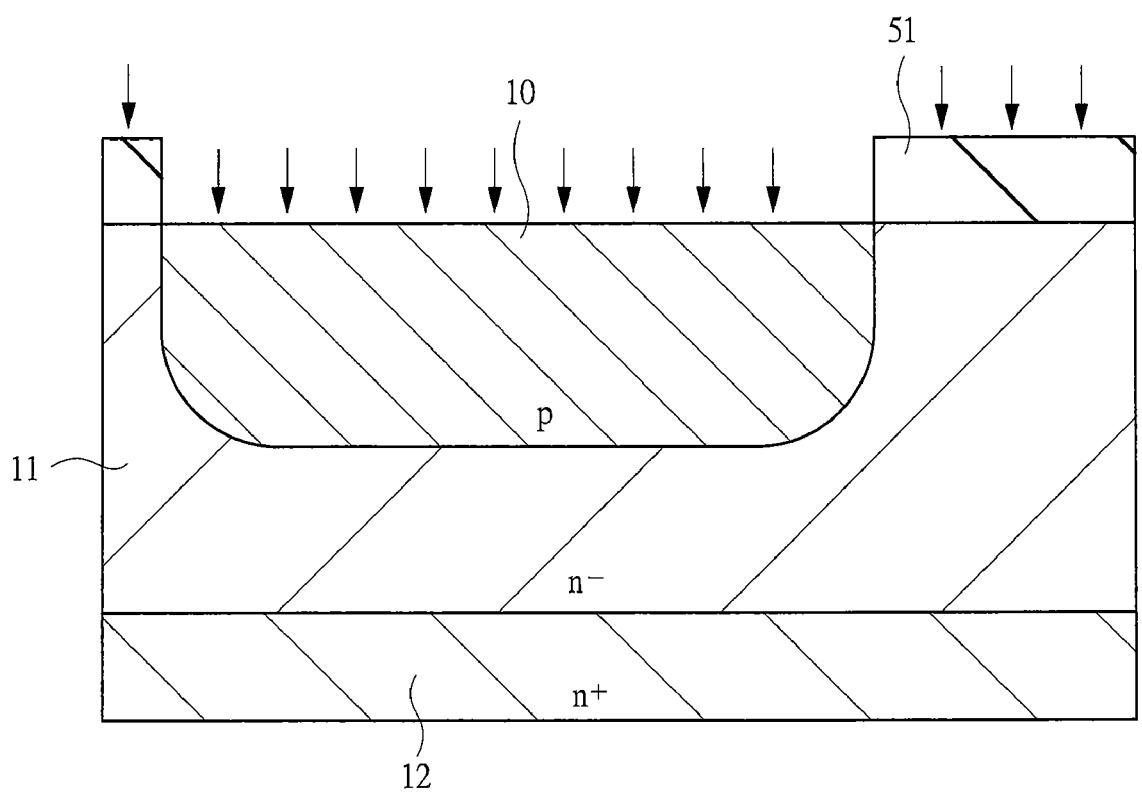
FIG. 6 is a cross-sectional view showing essential parts of the semiconductor device according to the first embodiment of the present invention in a step of a manufacturing processing therefor.

First, as shown in FIG. 6, the n⁻ layer 11 forming the drift region is formed over the n⁺ substrate 12, which is an n⁺-type silicon carbide substrate, by epitaxial growth. Then, by a lithography technique and ion implantation, a p-type impurity is introduced into a predetermined region using an ion implantation mask 51 to form the p well 10 which is an impurity region (a semiconductor region), in the front surface side of the n⁻ layer 11. The p well 10 becomes a so-called termination.

Figure 7:
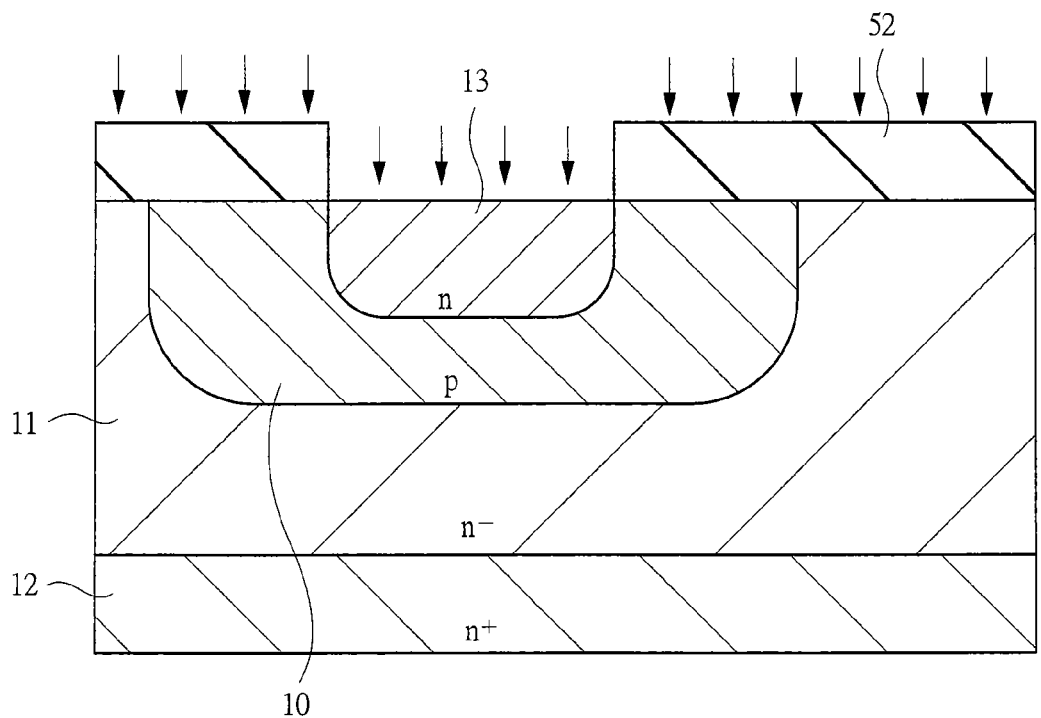
FIG. 7 is a cross-sectional view showing essential parts of the semiconductor device in the step following the step shown in FIG. 6.

Then, as shown in FIG. 7, by the lithography technique and the ion implantation, an n-type impurity is introduced into a predetermined region using an ion implantation mask 52 to form the n well 13 which is an impurity region (a semiconductor region), in the front surface side of the p well 10.

Figure 8:
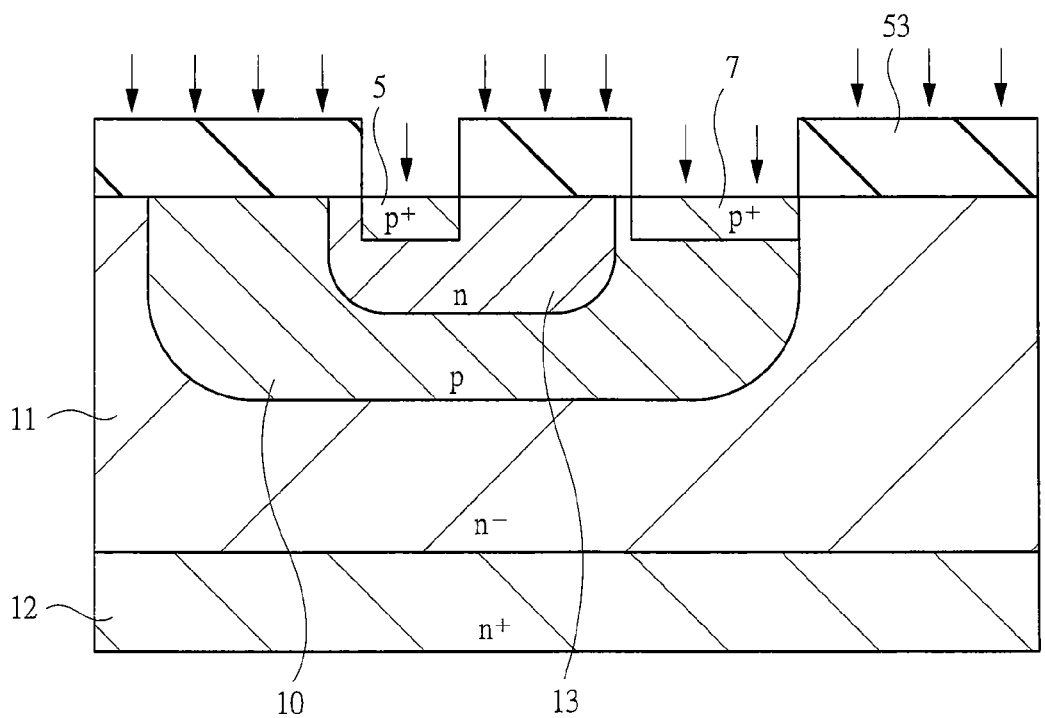
FIG. 8 is a cross-sectional view showing essential parts of the semiconductor device in the step following the step shown in FIG. 7.

Next, as shown in FIG. 8, by the lithography technique and the ion implantation, a p-type impurity is introduced into a predetermined region using an ion implantation mask 53 to form the p⁺ layer 7, which is an impurity region (a semiconductor region), in the front surface side of the p well 10 and the p⁺ layer 5, which is an impurity region (a semiconductor region), in the front surface side of the n well 13.

Figure 9:
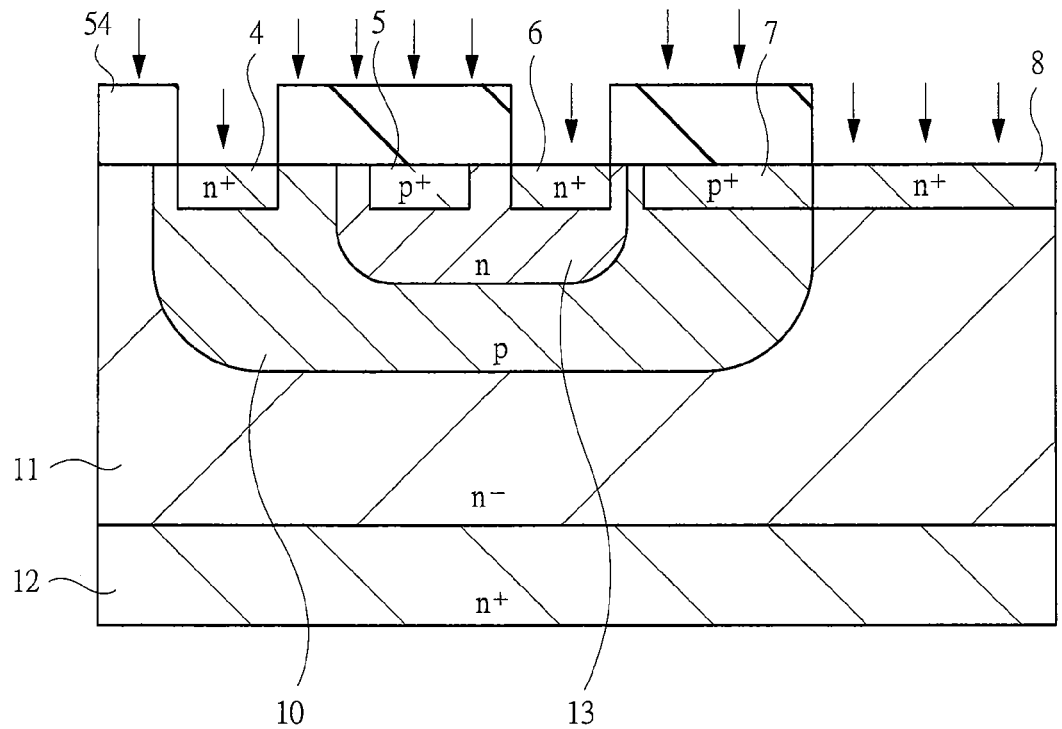
FIG. 9 is a cross-sectional view showing essential parts of the semiconductor device in the step following the step shown in FIG. 8.

Next, as shown in FIG. 9, by the lithography technique and the ion implantation, an n-type impurity is introduced into a predetermined region using an ion implantation mask 54, to form the n$^+$ layer 8, which is an impurity region (a semiconductor region), in the front surface side of the n$^-$ layer 11, the n$^+$ layer 4, which is an impurity region (a semiconductor region) in the front surface side of the p well 10 and the n$^+$ layer 6, which is an impurity region (a semiconductor region), in the front surface side of the n well 13.

As described above, the ion implantation to form the p well 10 forming the termination, the ion implantation to form the n well 13 forming the cathode of the pn diode 3 in the forward direction, the ion implantation to form the p$^+$ layer 5 forming the anode of the p-n diode 3 in the forward direction and the p$^+$ layer 7 for forming a contact lead, the ion implantation to form the n$^+$ layer 4 forming the cathode of the diode 2 in the reverse direction, and the ion implantation to form the n$^+$ layer 6 for forming a contact lead and the n$^+$ layer 8 forming the source region are carried out in order. However, the order of ion implantation can be changed.

Figure 10:
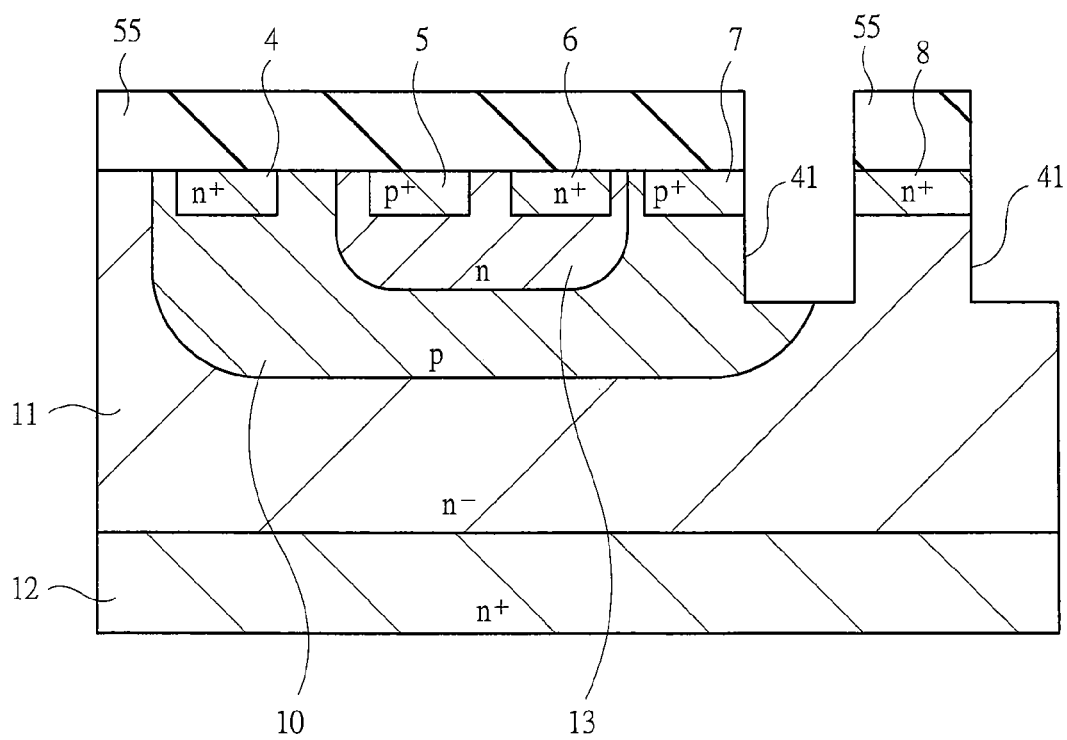
FIG. 10 is a cross-sectional view showing essential parts of the semiconductor device in the step following the step shown in FIG. 9.
Figure 11:
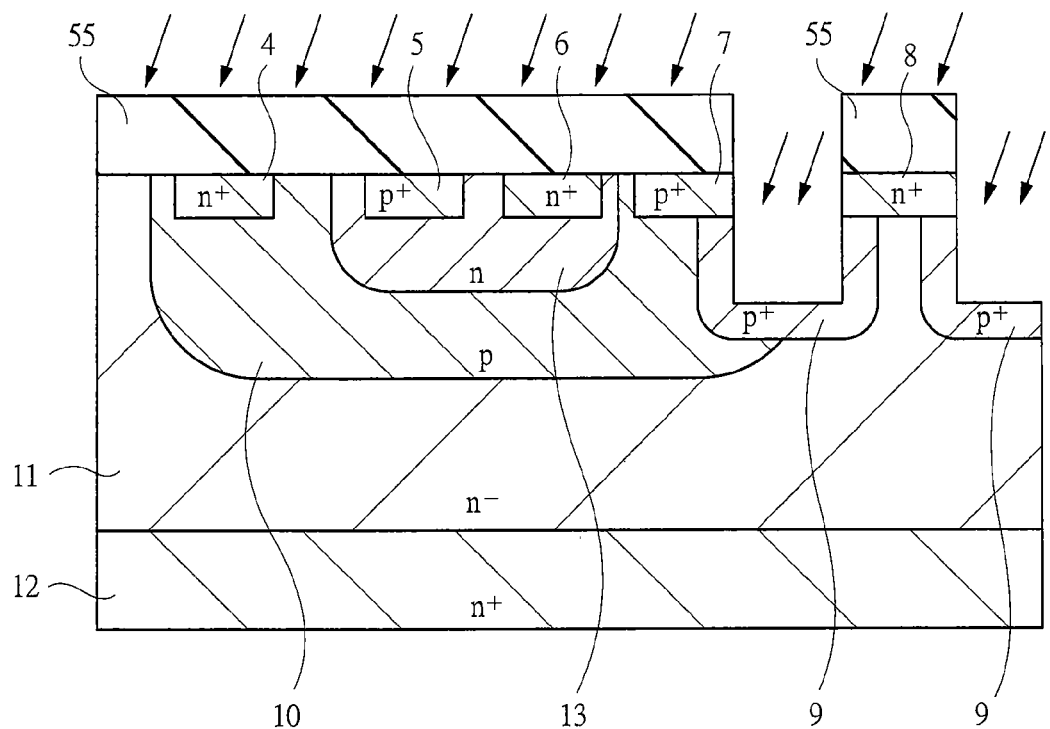
FIG. 11 is a cross-sectional view showing essential parts of the semiconductor device in the step following the step shown in FIG. 10.
Figure 12:
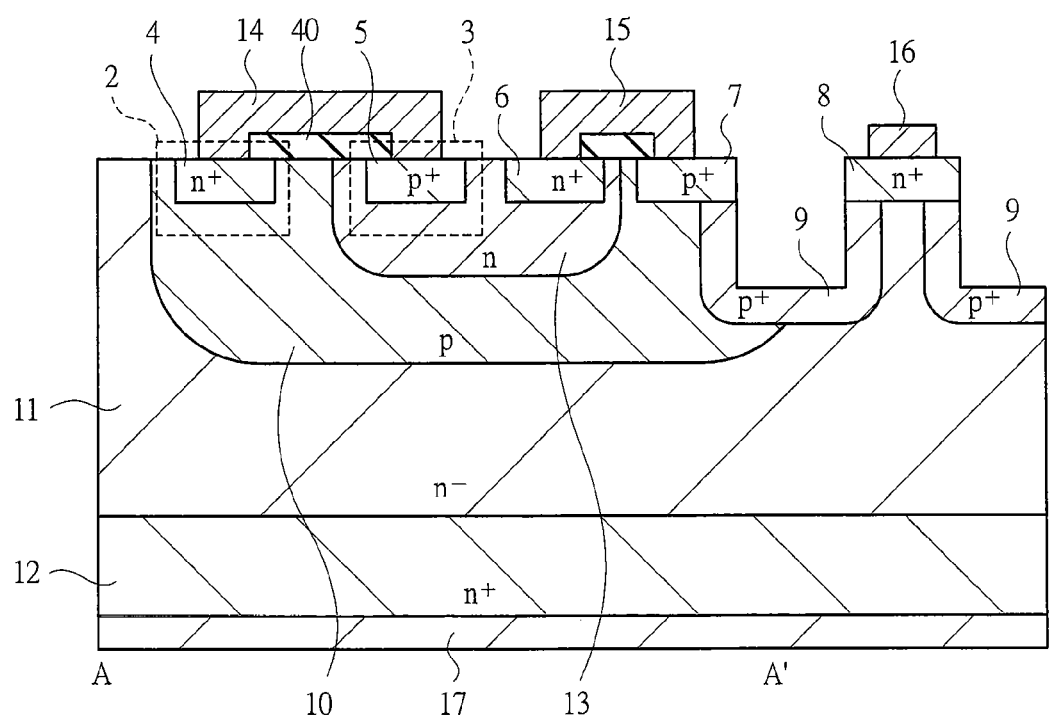
FIG. 12 is a cross-sectional view showing essential parts of the semiconductor device in the step following the step shown in FIG. 11.

Then, as shown in FIG. 10, a trench 41 is formed in the active region using an insulating film 55, such as a silicon oxide film, as a mask. Then, as shown in FIG. 11, a p-type impurity is introduced by oblique ion implantation to form the p$^+$ layer 9, which is an impurity region (a semiconductor region), in the front surface side of the n well 13.

After all of the impurity regions are formed, the impurities are activated by high-temperature annealing, contacts are formed, metal wirings are formed, and the semiconductor device is completed.

Here, a case in which no diode portion is provided unlike the semiconductor device according to the first embodiment is described. A semiconductor device having the same structure as the semiconductor device shown in FIG. 4 except that the n$^+$ layer 4, the p$^+$ layer 5, the n$^+$ layer 6, the n well 13 and the contact electrode 15 are omitted and the p$^+$ layer 7 forms a lead of the gate electrode 14, is a semiconductor device comprising a junction FET having no diode portion. Note that, the p well 10 forms a termination.

As described above, the junction FET having no diode portion is the normally-off type and has a problem of the low threshold voltage. However, in a case where the diode portion is provided in the same manner as the semiconductor device according to the first embodiment, when the gate voltage is low, most of the voltage applied to the gate electrode 14 is applied to the diode portion and the junction FET 1 is not turned on, and when the gate voltage becomes the built-in potential of the diode portion or more, the excess voltage is applied to the p$^+$ layer 9 forming the gate region of the junction FET 1. Therefore, the apparent threshold voltage of the junction FET 1 is increased and the margin for gate noise can be increased.

And, in the method of manufacturing the semiconductor device according to the first embodiment, with respect to a method of manufacturing a semiconductor device including no diode portion, the p well 10 forming the termination is used as the p layer of the pn diode 2, and the n well 13 is newly formed in the p well 10. And, the n$^+$ layer 4 of the pn diode 2 and the n$^+$ layer 6 forming the lead of the contact electrode 15 are formed concurrently with the n$^+$ layer 8 forming the source region. In addition, the p$^+$ layer 5 of the pn diode 3 is formed concurrently with the p$^+$ layer forming the lead of the gate electrode 14. And, the contact electrode 15 is formed concurrently with the gate electrode 14. As described above, the diode portion can be formed only by adding one mask for the n well 13 to the conventional manufacturing method.

In the first embodiment, a case of the junction FET of a trench type and a vertical-channel type is described. However, the same effect can be obtained in the normally-off type junction FET of a planar type and a lateral-channel type. And, although there are many methods of incorporating diodes in bi-directions in the same substrate other than the method according to the first embodiment, the same effect can be obtained by any layout or any process.

Second Embodiment

Figure 13:
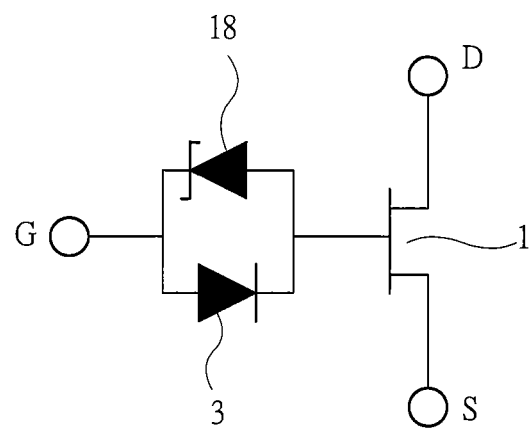
FIG. 13 is an equivalent circuit diagram of a semiconductor device according to a second embodiment of the present invention.
Figure 14:
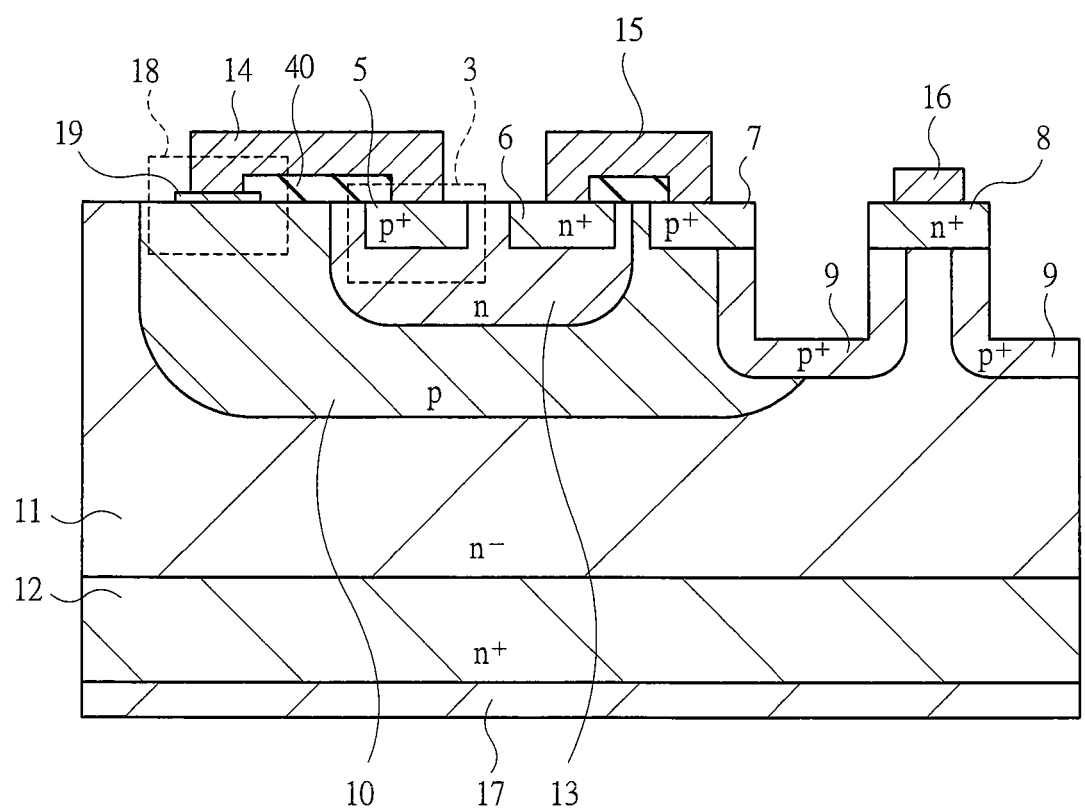
FIG. 14 is a cross-sectional view showing essential parts of the semiconductor device according to the second embodiment of the present invention.

In a second embodiment of the present invention, a semiconductor device comprising a junction FET as a gate-controlled type semiconductor element (a switching element, a transistor) is described with reference to FIGS. 13 and 14. FIGS. 13 and 14 are an equivalent circuit diagram of and a cross-sectional view showing essential parts of the semiconductor device according to the second embodiment, respectively.

As shown in FIGS. 13 and 14, the semiconductor device according to the second embodiment differs from the semiconductor device according to the first embodiment in that the diode in the reverse direction in the diode portion is not the pn diode 2 but a Schottky barrier diode 18. As shown in FIG. 14, the Schottky barrier diode 18 is formed by forming a Schottky metal 19 of metal contacting with the p well 10 to make junction having a rectification property with the p well 10 after the p well 10, which is a semiconductor region, is formed.

The Schottky barrier diode 18 has the built-in potential lower than that of the pn diode 2, and therefore has a characteristic that switching loss, in particular, loss in discharge at the gate, is small.

Third Embodiment

Figure 15:
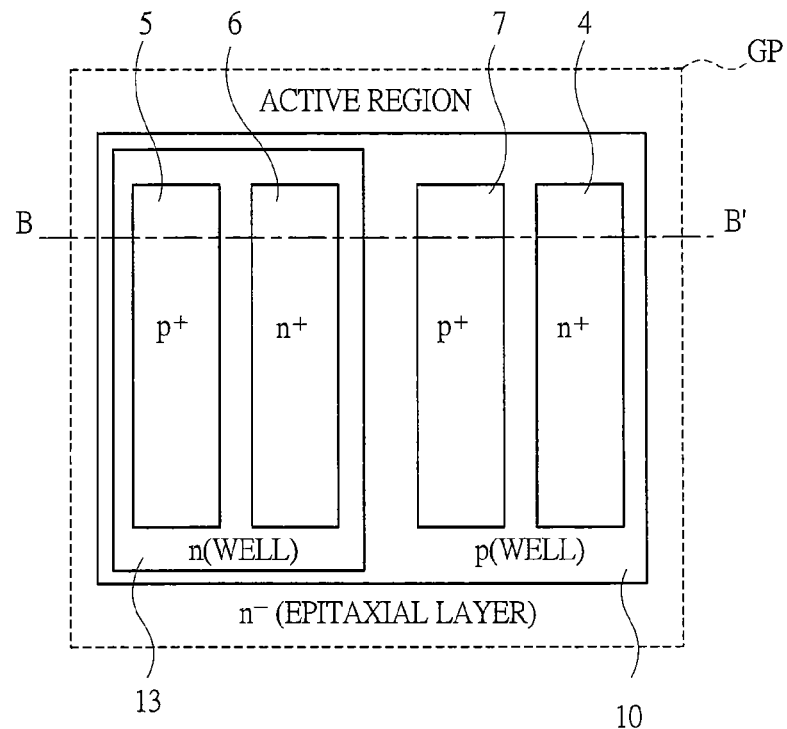
FIG. 15 is a plan view showing essential parts of a semiconductor device according to a third embodiment of the present invention.
Figure 16:
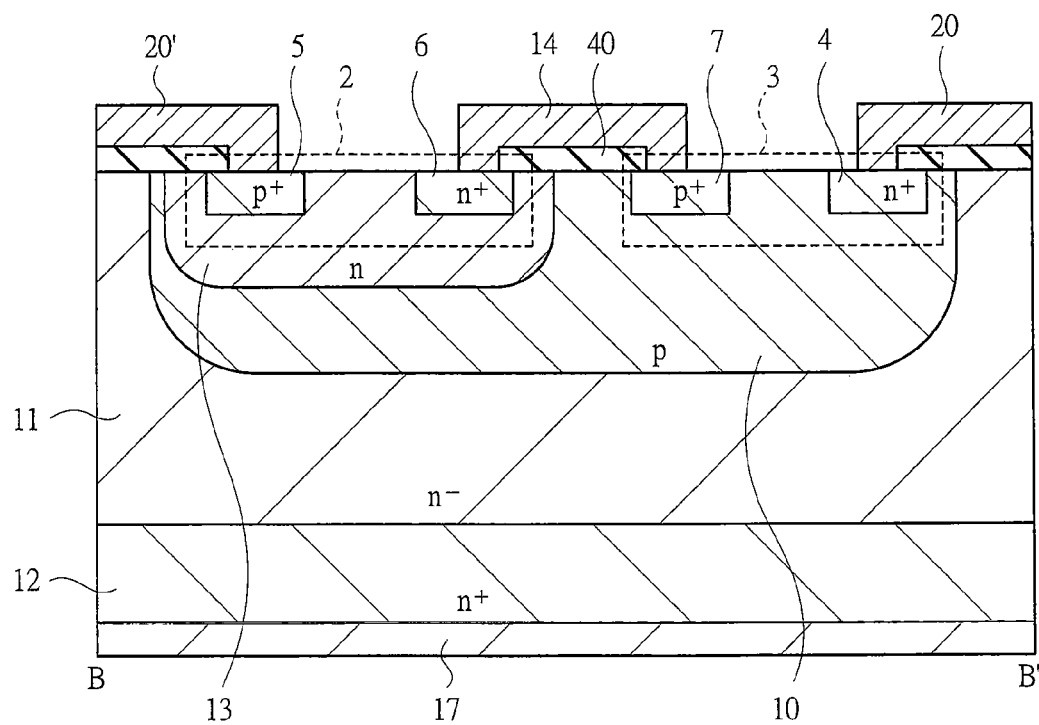
FIG. 16 is a cross-sectional view showing essential parts of the semiconductor device according to the third embodiment of the present invention.
Figure 17:
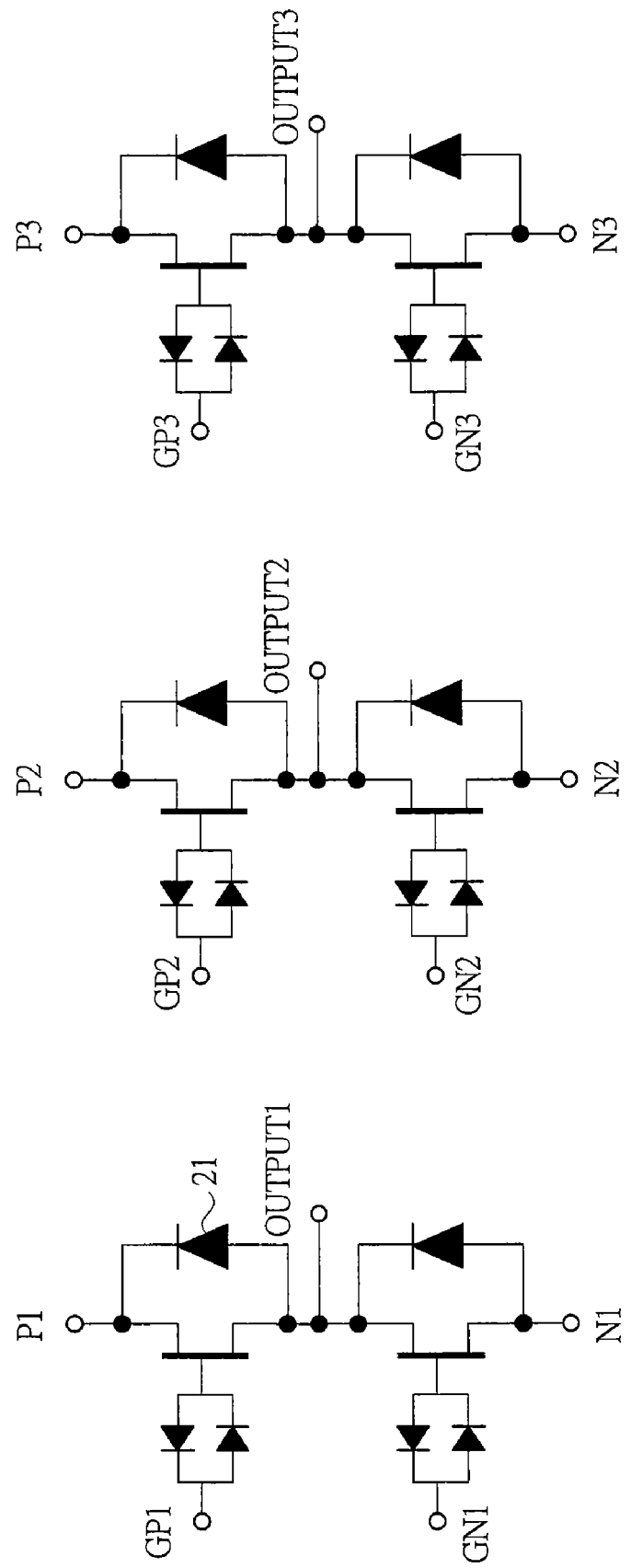
FIG. 17 is a circuit diagram in a case where the semiconductor device according to the third embodiment is applied to an inverter circuit.

In a third embodiment, a semiconductor device comprising a MISFET as a gate-controlled type semiconductor element (a switching element, a transistor) is described with reference to FIGS. 15 to 17. FIGS. 15 and 16 are a plan view showing essential parts of and a cross-sectional view showing essential parts of the semiconductor device according to the third embodiment, respectively. FIG. 15 is a plan view of the region of the gate pad GP shown in FIG. 2, for example, from which the gate pad GP is removed. A cross-sectional view taken along a line B-B' in FIG. 15 is shown in FIG. 16. FIG. 17 shows a circuit diagram in a case where the semiconductor device according to the third embodiment is applied to an inverter circuit.

Figure 26:
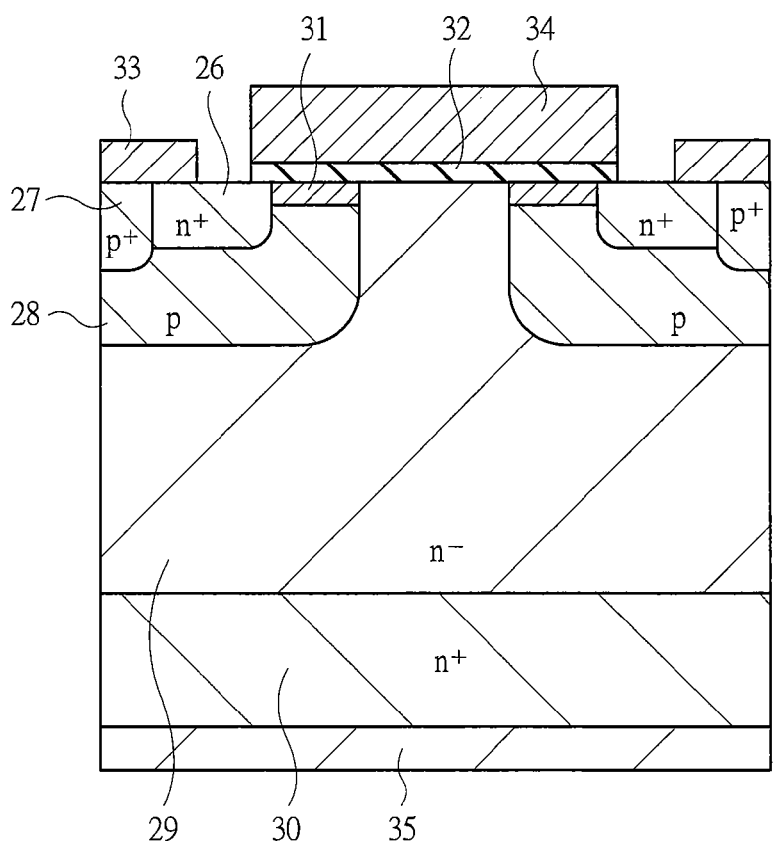
FIG. 26 is a cross-sectional view of a buried channel MISFET.

As shown in FIGS. 15 and 16, the semiconductor device according to the third embodiment comprises a MISFET (see FIG. 26, for example) and a diode portion incorporated in the region of the gate pad GP shown in FIG. 2, for example. A pn diode 2 in a reverse direction is composed of an n well 13 and a p$^+$ layer 5 formed in the n well 13. And, a pn diode 3 in a forward direction is composed of a p well 10 and an n$^+$ layer 4 formed in the p well 10. Note that, reference symbols 20 and 20' in FIG. 10 denote gate wirings, which are formed concurrently with a gate electrode 14.

According to this embodiment, also in the MISFET, a threshold voltage can also be increased without compromising a switching characteristic. Note that, in the same manner as the second embodiment, the Schottky barrier diode 18 can be applied to the diode in the reverse direction.

And, an inverter circuit is a circuit for converting a direct current into an alternating current having a desired frequency and is widely used for driving a motor and the like. In applications requiring a large current, such as driving of a hybrid or electric car, noise tends to appear at the gate. Therefore, the present invention is particularly advantageous if the present invention is applied to the inverter circuit as shown in FIG. 17. Note that, a reference symbol 21 in FIG. 17 denotes a freewheel diode.

Fourth Embodiment

Figure 18:
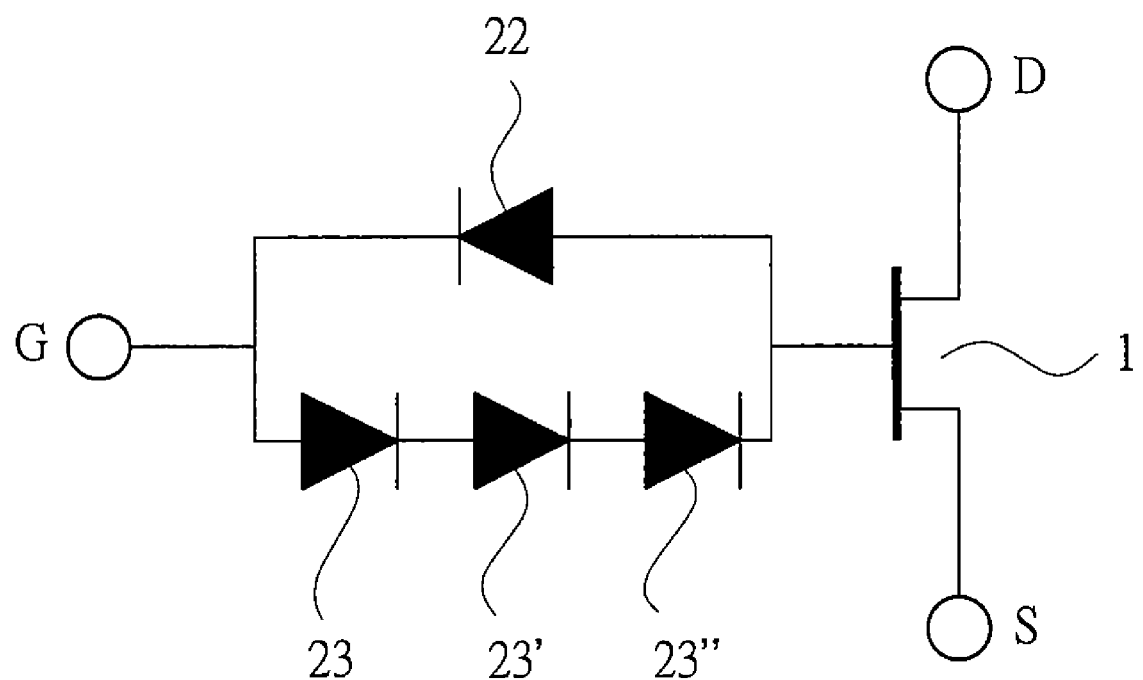
FIG. 18 is an equivalent circuit diagram of a semiconductor device according to a fourth embodiment of the present invention.
Figure 19:
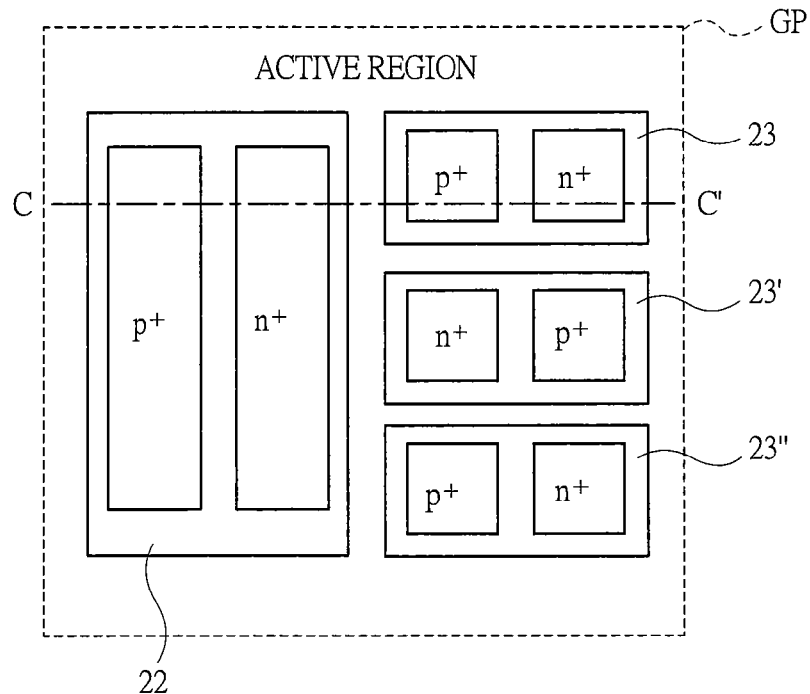
FIG. 19 is a plan view showing essential parts of the semiconductor device according to the fourth embodiment of the present invention.
Figure 20:
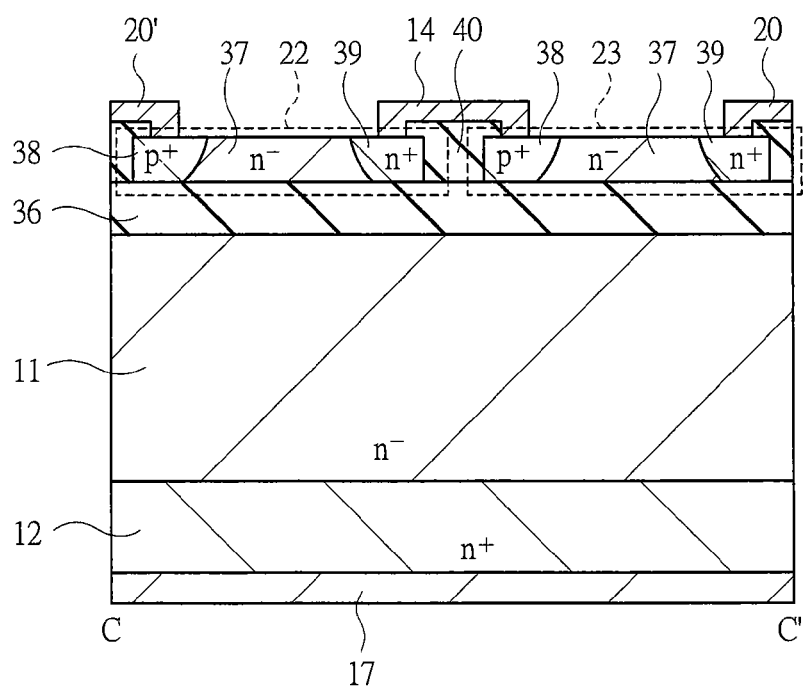
FIG. 20 is a cross-sectional view showing essential parts of the semiconductor device according to the fourth embodiment of the present invention.

In a fourth embodiment, first, a semiconductor device having a junction FET as a gate-controlled type semiconductor element (a switching element, a transistor) is described with reference to FIGS. 18 to 20. FIGS. 18 to 20 are an equivalent circuit diagram of, a plan view showing essential parts of and a cross-sectional view showing essential parts of the semiconductor device according to the fourth embodiment, respectively. FIG. 19 is a plan view of the region of the gate pad GP shown in FIG. 2, for example, from which the gate pad GP is removed. A cross-sectional view taken along a line C-C' in FIG. 19 is shown in FIG. 20.

The semiconductor device according to the fourth embodiment differs from the semiconductor device according to the first embodiment in that the diode portion is not made of silicon carbide as a base material but made of polysilicon as the base material. That is, a pn diode 22 in a reverse direction and pn diodes 23, 23' and 23" in a forward direction are made of polysilicon. Since a diode made of polysilicon has a built-in potential of about 0.6V, it is effective to connect a plurality of diodes in the forward direction in series to sufficiently increase the threshold voltage. In the fourth embodiment, three diodes in the forward direction are connected in series, so that the threshold voltage is increased by about 0.6×3=1.8V.

In the fourth embodiment, a polysilicon film 37 is deposited over an insulating film 36, and a diode portion is formed in the polysilicon film 37. Therefore, a semiconductor element formed in the active region is not limited to a junction FET but can be other semiconductor elements, such as MISFET and IGBT. Note that, FIGS. 19 and 20 show only below the region of the gate pad GP in which the diode portion is formed.

The pn diode 22 in the reverse direction and the pn diodes 23, 23' and 23" in the forward direction are electrically separated by the insulating film 36, the anode of the pn diode 22 in the reverse direction and the cathode of the diode 23" in the forward direction are electrically connected to a gate region (a gate wiring) in the active region, and the cathode of the pn diode 22 in the reverse direction and the anode of the pn diode 23 in the forward direction are electrically connected to a gate electrode 14, that is, the gate pad GP. And, the pn diodes 23, 23' and 23" in the forward direction are connected in series, the cathode of the pn diode 23 is connected to the anode of the pn diode 23', and the cathode of the pn diode 23' is connected to the anode of the pn diode 23".

Next, a method of manufacturing a semiconductor device according to the fourth embodiment is described in order with reference to FIGS. 21 to 24. FIGS. 21 to 24 are cross-sectional views showing essential parts of the semiconductor device in manufacturing steps according to the fourth embodiment.

Figure 21:
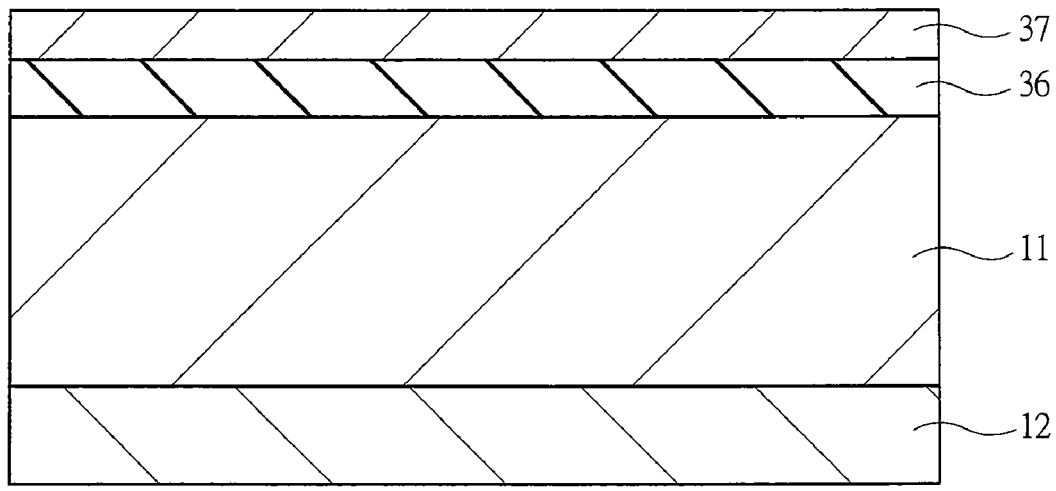
FIG. 21 is a cross-sectional view showing essential parts of the semiconductor device according to the fourth embodiment of the present invention in a step of a manufacturing processing therefor.

First, as shown in FIG. 21, an n⁻ layer 11 forming a drift region of a junction FET is formed over an n⁺ substrate 12, which is an n⁺-type silicon carbide substrate, by epitaxial growth, and then, the junction FET (the junction FET shown in FIG. 4 from which the diode portion is removed, for example) is formed in an active region. The junction FET can be formed by the same manufacturing method as in the first embodiment described above, for example. Then, the insulating film 36, which is made of silicon oxide, for example, is formed over the n⁻ layer 11, and the n⁻-type polysilicon film 37 is formed over the insulating film 36.

Figure 22:
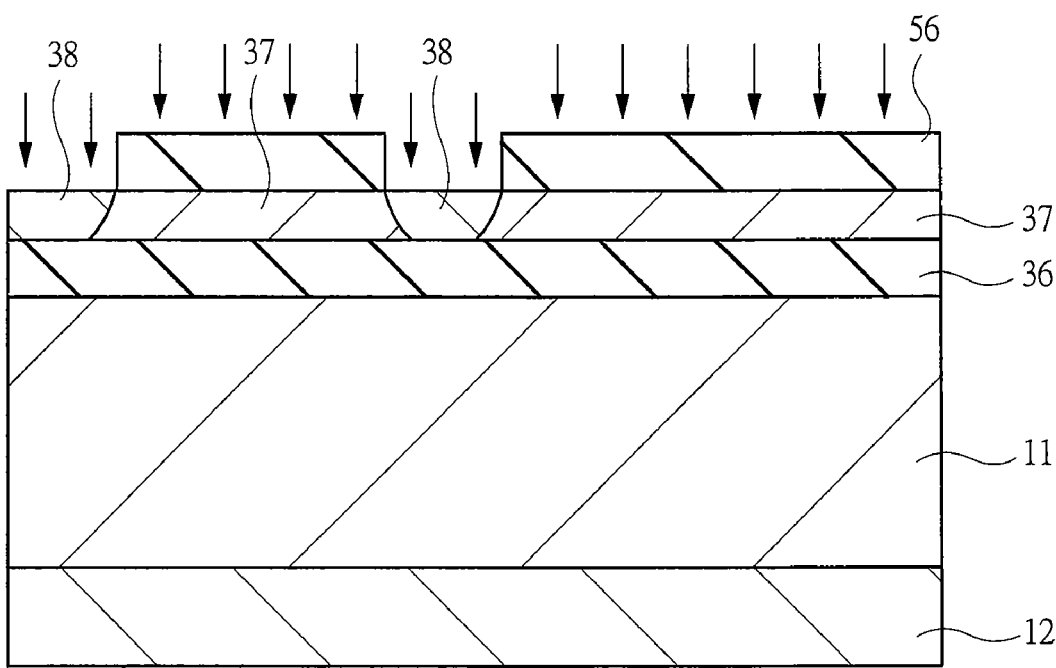
FIG. 22 is a cross-sectional view showing essential parts of the semiconductor device in the step following the step shown in FIG. 21.

Then, as shown in FIG. 22, by the lithography technique and the ion implantation, a p-type impurity is introduced into a predetermined region using a resist film 56 to form a p⁺ layer 38 contacting with the insulating film 36 in a part of the polysilicon film 37.

Figure 23:
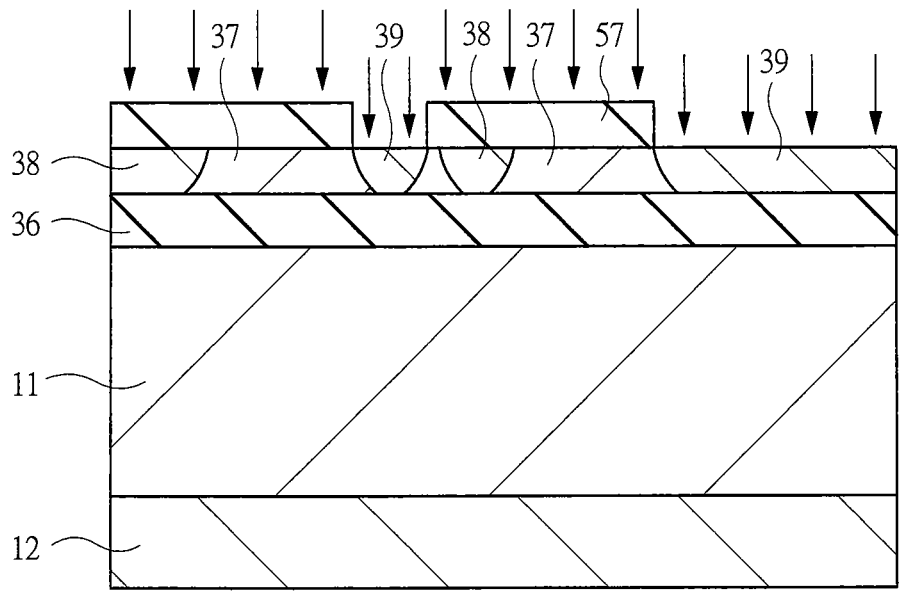
FIG. 23 is a cross-sectional view showing essential parts of the semiconductor device in the step following the step shown in FIG. 22.

Then, as shown in FIG. 23, by the lithography technique and the ion implantation, an n-type impurity is introduced into a predetermined region using a resist film 57 as a mask to form an n⁺ layer 39 contacting with the insulating film 36 in a part of the polysilicon film 37.

Figure 24:
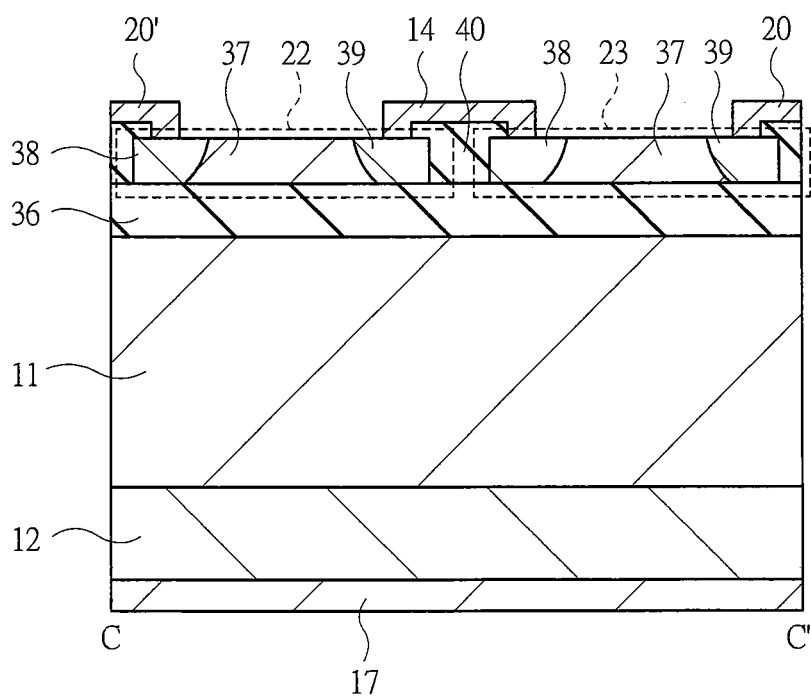
FIG. 24 is a cross-sectional view showing essential parts of the semiconductor device in the step following the step shown in FIG. 23.

Next, as shown in FIG. 24, the polysilicon film 37 is patterned using a resist mask (not shown) as a mask, and then, a cavity formed by the patterning is filled with an insulating film 40. Then, wiring including gate wirings 20 and 20' is formed and the semiconductor device is completed.

As described above, in the manufacturing method according to the fourth embodiment, after the semiconductor device is formed in the active region, the insulating film 36 and the n⁻-type polysilicon film 37 are formed. And then, respective pn diodes 22, 23, 23' and 23" electrically separated from each other can be formed by the ion implantation and etching of the polysilicon film 37.

Fifth Embodiment

Figure 25:
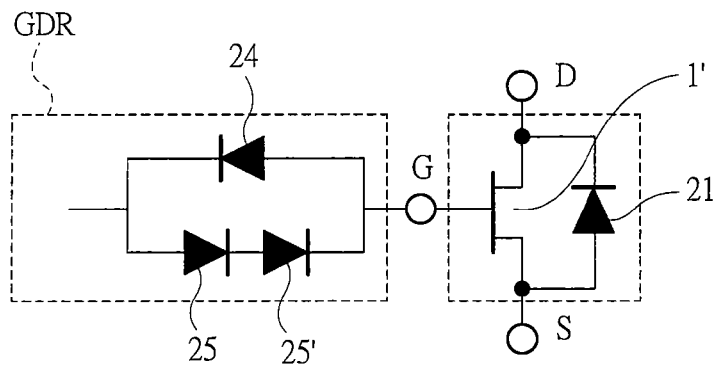
FIG. 25 is an equivalent circuit diagram of a semiconductor device according to a fifth embodiment of the present invention.

In a fifth embodiment of the present invention, a semiconductor device comprising a junction FET and a gate drive circuit as a gate-controlled type semiconductor element (a switching element, a transistor) is described with reference to FIG. 25. FIG. 25 is an equivalent circuit diagram showing the semiconductor device according to the fifth embodiment of the present invention.

In the first and second embodiments, the diode portion is incorporated in the junction FET 1, which is a semiconductor element. However, in the fifth embodiment, the diode portion is not arranged in the junction FET 1 or a module including the junction FET 1 but in a gate drive circuit GDR controlling the gate. Therefore, while silicon carbide is used as a base material of the semiconductor element, silicon, which is inexpensive compared with silicon carbide, can be used as a base material of the diode portion.

The gate drive circuit GDR comprises a pn diode 24 and pn diodes 25 and 25' connected in anti-parallel on an output side thereof, and the built-in potential of the pn diodes 25 and 25' connected in a forward direction with respect to the gate of a junction FET 1' having no diode portion is larger than the built-in potential of the pn diode 24 connected in a reverse direction with respect to the gate of the junction FET 1'.

Also in this case, as in the second embodiment, in order to increase the built-in potential, a plurality of pn diodes 25 and 25' in the forward direction are connected in series. In the fifth embodiment, the apparent threshold voltage can be adjusted by adjusting the number of pn diodes connected in series according to the threshold voltage of the completed semiconductor element.

Also in the fifth embodiment, the semiconductor element is not limited to the junction FET but can be an element that requires adjustment of the threshold voltage, such as a buried channel MISFET and an IGBT. In addition, the diode 24 in the reverse direction can be a Schottky barrier diode made of silicon having the low built-in potential.

In the foregoing, the invention made by the inventors of the present invention has been concretely described based on the embodiments. However, it is needless to say that the present invention is not limited to the foregoing embodiments and various modifications and alterations can be made within the scope of the present invention.

In the embodiments described above, cases in which the gate-controlled type semiconductor element (a switching element, a transistor) is the junction FET or the MISFET are described. However, the semiconductor element can also be the IGBT (insulated gate bipolar transistor). This is because the IGBT has basically the same structure as the MISFET except that the drain region of the substrate is not the $n^+$ type (see FIG. 26, for example) but the $p^+n^+$ type.

The present invention has a wide variety of applications in the semiconductor device manufacturing industry.

What is claimed is:

1. A semiconductor device comprising:
a semiconductor element made of silicon carbide as a base material having a plurality of diodes incorporated over a chip of the semiconductor element,
wherein a first diode of the plurality of diodes has an anode connected to a gate of the semiconductor element and a cathode connected to a gate pad of the chip,
wherein a second diode of the plurality of diodes has a cathode connected to the gate of the semiconductor element and an anode connected to the gate pad of the chip, and
wherein a capacitance of said plurality of diodes is less than a capacitance of said gate to control a threshold voltage of said semiconductor element to be equal to or higher than a built-in potential of said plurality of diodes.

2. The semiconductor device according to claim 1, wherein the plurality of diodes are pn diodes made of silicon carbide as a base material.

3. The semiconductor device according to claim 1, wherein the first diode is a Schottky barrier diode made of silicon carbide as a base material, and
wherein the second diode is a pn diode made of silicon carbide as a base material.

4. The semiconductor device according to claim 1, wherein the plurality of diodes are pn diodes made of polysilicon as a base material.

5. The semiconductor device according to claim 4, wherein the second diode is composed of two or more pn diodes made of polysilicon as a base material connected in series.

6. The semiconductor device according to claim 1, wherein the semiconductor element is any of a junction FET, a MISFET and an IGBT.

7. The semiconductor device according to claim 1, wherein said plurality of diodes is configured to distribute a voltage applied to the gate pad between said plurality of diodes and a junction of said semiconductor element according to a ratio of said capacitance of said plurality of diodes to said capacitance of said gate.

8. A semiconductor device, comprising:
a silicon carbide substrate including a first electrode and a second electrode over a first surface and a third electrode over a second surface opposite to the first surface;
a junction FET provided over a main surface of the silicon carbide substrate; and
a diode provided over the main surface of the silicon carbide substrate,
wherein the main surface of the silicon carbide substrate of the first conductivity type is provided with a drift region of a first conductivity type of the junction FET,
wherein the main surface of the silicon carbide substrate is provided with a gate region of a second conductivity type opposite to the first conductivity type contacting with the drift region,
wherein the first electrode is electrically connected to the gate region,
wherein the second electrode and the third electrode are electrically connected to the drift region of the junction FET,
wherein the diode is electrically connected between the first electrode and the gate region,
wherein the diode is composed of a first diode and a second diode connected in parallel,
wherein the first diode has a cathode electrically connected to the first electrode and an anode electrically connected to a gate,
wherein the second diode has an anode electrically connected to the first electrode and a cathode electrically connected to the gate,
wherein the main surface of the silicon carbide substrate under the first electrode is provided with a first well of the second conductivity type contacting with the gate region,
wherein the main surface of the silicon carbide substrate is provided with a second well of the first conductivity type in the first well,
wherein the main surface of the silicon carbide substrate is provided with a first semiconductor region of the first conductivity type in the first well,
wherein the main surface of the silicon carbide substrate is provided with a second semiconductor region of the second conductivity type in the second well,
wherein the cathode of the first diode is the first semiconductor region,
wherein the anode of the first diode is the first well,
wherein the cathode of the second diode is the second well, and
wherein the anode of the second diode is the second semiconductor region.

* * * * *